United States Patent
Kageyama

(10) Patent No.: US 6,323,498 B1
(45) Date of Patent: Nov. 27, 2001

(54) CHARGED PARTICLE BEAM IRRADIATION APPARATUS AND IRRADIATION METHOD USING THE APPARATUS

(75) Inventor: Kaneo Kageyama, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/264,465

(22) Filed: Mar. 9, 1999

(30) Foreign Application Priority Data

Mar. 18, 1998 (JP) ................................................ 10-068262

(51) Int. Cl.[7] .............................. G03F 9/00; H01J 37/304
(52) U.S. Cl. ................................. 250/492.22; 250/492.2; 250/492.3; 250/310; 250/396 R; 250/398
(58) Field of Search ........................... 250/492.2, 492.22, 250/492.3, 398, 396 R, 310

(56) References Cited

U.S. PATENT DOCUMENTS

| 5,614,725 | * | 3/1997 | Oae et al. ...................... 250/492.22 |
| 5,952,133 | * | 9/1999 | Nakasuji ............................... 430/22 |

FOREIGN PATENT DOCUMENTS 427908A    1/1992  (JP).
7159128A   6/1995  (JP).

* cited by examiner

*Primary Examiner*—Bruce Anderson
*Assistant Examiner*—Nikita Wells
(74) *Attorney, Agent, or Firm*—Kenyon & Kenyon

(57) ABSTRACT

A charged particle beam irradiation apparatus includes a specimen stage for holding a specimen; a specimen stage drive unit for moving the specimen stage; a detector for detecting the amount of displacement of the moved specimen stage; a charged particle beam optical unit for irradiating the specimen with a charged particle beam; an image display unit for displaying an image of the specimen, the image being formed by using charged particles or electromagnetic waves emitted from the specimen irradiated with the charged particle beam; a marker display unit for displaying a marker on each target position on an image of the specimen, on a viewscreen of the image display unit; a marker position input unit for designating reference positions on the image of the specimen; and a marker position calculation unit for calculating the position on which each marker is displayed on the image of the specimen on the viewscreen of the image display unit; wherein the position on the image of the specimen, on which each marker is to be displayed, is also moved based on both the calculated position of each marker, which has been calculated by the position calculation unit, and the amount of displacement of the moved specimen stage, the amount of displacement being detected by the detector.

14 Claims, 9 Drawing Sheets

FIG.5
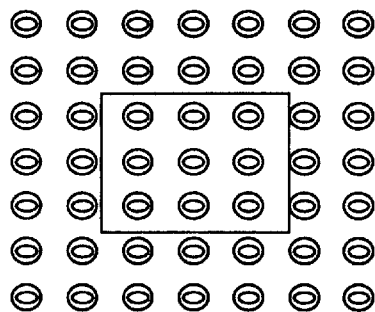
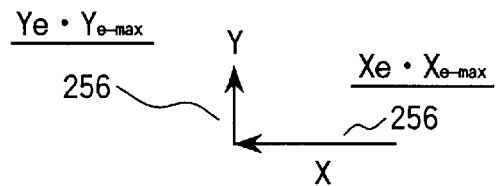
FIG.6A
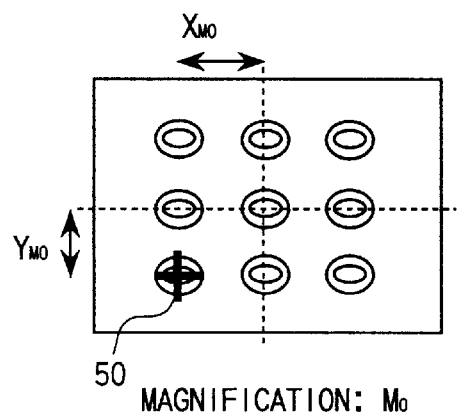
MAGNIFICATION: $M_0$
FIG.6B
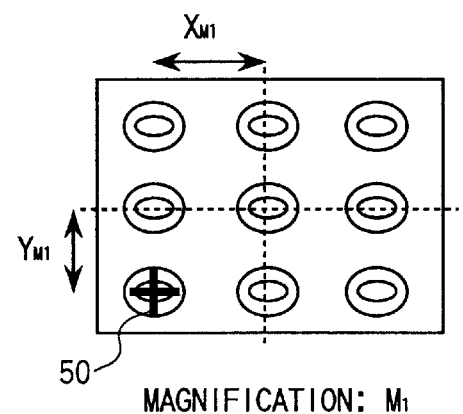
MAGNIFICATION: $M_1$
FIG.7A
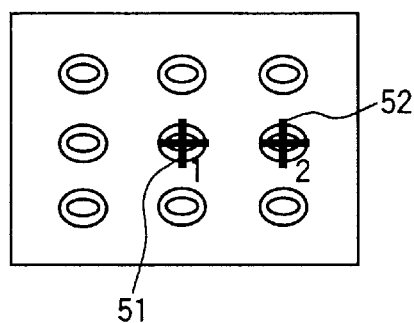
FIG.7B
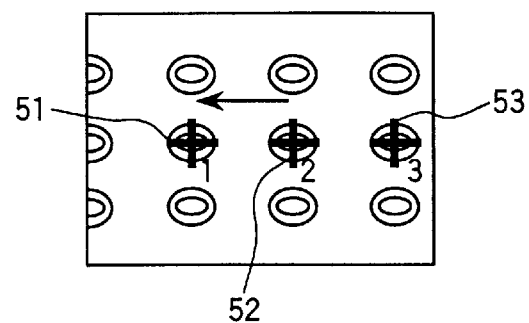

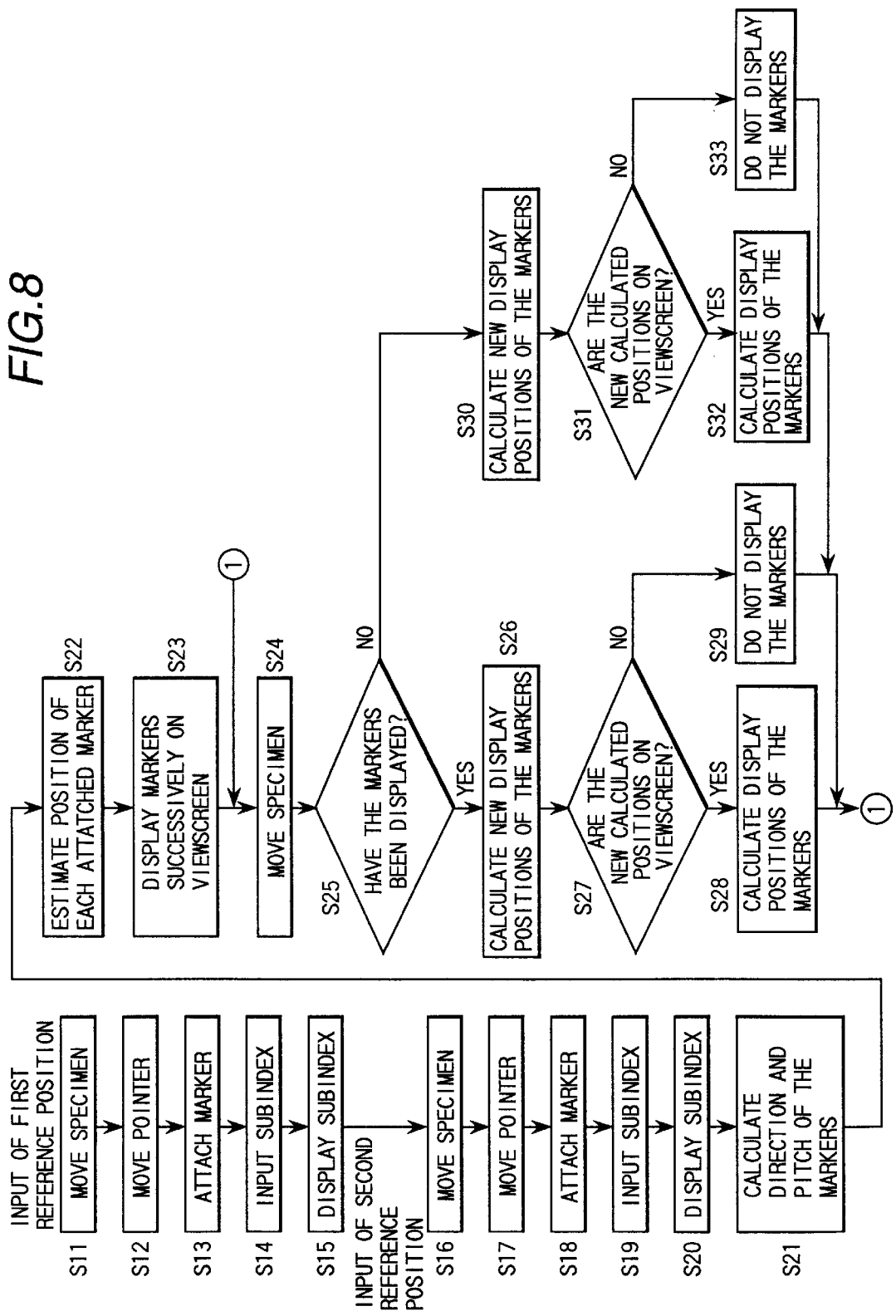

CHARGED PARTICLE BEAM IRRADIATION APPARATUS AND IRRADIATION METHOD USING THE APPARATUS

BACKGROUND OF THE INVENTION

The present invention relates to a charged particle beam irradiation apparatus such as a scanning electron microscope, an X-ray micro-analyzer, and so on, and an irradiation method using the irradiation apparatus, and especially relates to an improved charged particle beam irradiation apparatus and an irradiation method using the irradiation apparatus, in which a display unit is used to designate a position on an image of a target area in a specimen, the target area being observed or analyzed by irradiation with a charged particle beam.

Scanning electron microscope, an X-ray micro-analyzer, etc., are known charged particle irradiation apparatuses. In a scanning electron microscope, a specimen is observed or inspected by using a magnified image of the specimen, which is formed by detecting secondary electrons or reflected electrons generated from the specimen irradiated with an electron beam. On the other hand, in an X-ray micro-analyzer, a specimen is examined by analyzing an X-ray emitted from the specimen irradiated with an electron beam. When a target area in a specimen, to be observed or analyzed by irradiation with a charged particle beam, is designated, a larger view of the specimen is displayed on an image display unit such as a CRT, an observation monitor, etc., by decreasing the magnification of the charged particle beam irradiation apparatus, and an image of the designated area in the specimen is moved near the central point on a viewscreen of the image display unit. Afterward, by gradually increasing the magnification, a view with the required magnification is obtained. However, since the magnified size of an inspected region in the specimen is smaller than the image resolution of the image display unit at the low magnification, the fine structure of the specimen is invisible, and it is difficult to find a point in the specimen to observe. Thus, an operator searches an inspected point in the displayed view by alternately repeating the specimen movement performed by operating a specimen fine movement device, and increasing the signification; or by moving the specimen fine movement device while observing the specimen with the magnification kept somewhat high.

Recently, there has been a stronger tendency for the inspection of a semiconductor memory to be performed with a scanning electron microscope in the fabrication processing of semiconductor memories. Usually in a semiconductor memory, a large number of cells with the same structure are arranged in an orderly latticework. Therefore, it is very difficult to quickly find a target cell on the viewscreen of a scanning electron microscope. when an operator searches a target cell in a specimen such as the above-mentioned semiconductor memory, the operator needs to memorize the row and column coordinates of the target cell in the specimen, and then find the target cell by counting the number of rows and columns in the latticework pattern by maintaining a somewhat high magnification such that the operator can discriminate each cell, and by gradually moving the specimen with a specimen fine movement device.

In a new type scanning electron microscope such that disclosed in Japanese Patent Application Laid-Open Hei 4-27908, if an operator designates any target position which s/he wants to observe in an image displayed on a viewscreen of an image display unit, a specimen fine movement device is automatically controlled by a motor so that the designated position is set at the central position of the viewscreen of the image display device. However, the operator needs to find the target position on the image of the specimen, which gives a comparatively heavy load on the operator.

The following method using the above new type scanning electron microscope has been devised as a measure to reduce the load of the operator having to designate a target position on the viewscreen of the image display unit. That is, in the new type scanning electron microscope, the first and second windows for displaying two images of the specimen, which are processed with high and low magnification respectively, are provided in the image display unit of this scanning electron microscope. Moreover, an area cursor is also displayed in the first window for the image processed with low magnification. Furthermore, it is possible to display the region inside the area cursor in the second window for high magnification. Thus, if the operator intends to observe a target cell at a position far from a terminal side position in a semiconductor memory, from which the searching of the target cell is started, the image of the specimen is displayed in the first window with a sufficiently decreased magnification, and the position where the target cell is located is enclosed in the area cursor. Further, the region enclosed in the area cursor is displayed in the second window with an appropriately increased magnification.

However, in the above-mentioned conventional scanning electron microscopes, if an operator searches for a position apart from one at a terminal side of a specimen by tens of columns or rows in an image formed with the magnification kept high to a extent such that the operator can discriminate the structure of a cell to be analyzed, the operator has to count the number of columns or rows from the terminal side to the position of the target cell. Also, in the scanning electron microscope with the ability to display images of the specimen at different magnifications, since an image of the target cell structure to be analyzed is too small on a viewscreen displaying a low-magnification image, it is difficult to count the number of columns or rows of cells. Even if the scanning electron microscope has the ability to automatically move the designated position of an image of the target cell in the specimen displayed on the viewscreen to the central position of the viewscreen, it is still necessary to count cells in the specimen while maintaining the magnification as high as necessary. Further, if the target cell is at a position far from a terminal side of the specimen by tens or hundreds of columns or rows of cells, since the target cell cannot be found with single specimen-movement operation, it is necessary to repeat the specimen-movement operation to find the target cell. The parallel execution of both the counting of the number of columns or rows and the repeating of the specimen-movement operation is likely to cause an error in the operator's counting of the number of columns or rows, for example, missing some columns or rows.

SUMMARY OF THE INVENTION

The present invention has been achieved in consideration of the above mentioned problems. For example, it is effective for solving the problems of both providing a means to reduce a burden of finding a target position in a specimen, and of counting the number of columns or rows in an orderly latticework pattern of cells in the specimen with the same structure. Thus, an object of the present invention is to provide a charged particle beam irradiation apparatus wherein the searching for target cells to be observed in a specimen by operating a viewscreen with images of cells of the specimen can be easily carried out by an operator even if there are many cells arranged in the specimen in an orderly latticework.

The above object of the present invention is attained by providing a charged particle beam irradiation apparatus in which if an operator attaches a marker to a position to be observed on the image of a specimen, the marker also is moved along with the position of the specimen image as though the marker were attached to the position of the actual specimen when the image of the specimen is moved.

The present invention provides a charged particle beam irradiation apparatus comprising:

a specimen stage for holding a specimen;

a specimen stage drive unit for moving the specimen stage, a detector for detecting the amount of displacement of the moved specimen stage;

a charged particle beam optical unit for irradiating the specimen with a charged particle beam;

an image display unit for displaying an image of the specimen, the image being formed by using charged particles or electromagnetic waves emitted from the specimen irradiated with the charged particle beam;

a marker display unit for displaying a marker on each target position on an image of the specimen, the image being displayed on a viewscreen of the image display unit;

a marker position input unit for designating reference positions on the image of the specimen, on which respective markers are displayed; and a marker position calculation unit for calculating the position on which each marker is displayed on the image of the specimen on the viewscreen of the image display unit;

wherein, when the specimen stage is moved, the position on the image of the specimen on which each marker is to be displayed is also moved based on both the calculated position of each marker, which has been calculated by the position calculation unit, and on the amount of displacement of the moved specimen stage, the amount of displacement being detected by the detector.

The present invention further provides a charged particle beam irradiation apparatus comprising:

a charged particle beam optical unit for irradiating a specimen with a charged particle beam;

a charged particle beam deflection unit for moving an area on the specimen, which is irradiated with a charged particle;

an image display unit for displaying an image of the specimen, the image being formed by using charged particles or electromagnetic waves emitted from the specimen irradiated with the charged particle beam;

a marker display unit for displaying a marker on each target position on the image of the specimen, the image being displayed on a viewscreen of the image display unit;

a marker position input unit for designating reference positions on the image of the specimen, in which respective markers are displayed; and a marker position calculation unit for calculating the position on which each marker is displayed on the image of the specimen on the viewscreen of the image display unit, along with the amount of displacement of the image moved by the charged particle beam deflection unit;

wherein, when the image is moved by the charged particle beam deflection unit, the position on the image of the specimen on which each marker is to be displayed is also moved, based on both the calculated position of each marker, the position being calculated by the position calculation unit, and the amount of displacement of the image, the image displacement being calculated by the position calculation unit.

Moreover, in accordance with the above charged particle beam irradiation apparatus, the marker display unit displays a marker on the position on the image of the specimen corresponding to the same position in the coordinate system for the specimen, even if the image of the specimen is moved by moving the specimen stage.

Further, in accordance with the above charged particle beam irradiation apparatus, the marker display unit automatically displays markers by successively changing each of subindices for the markers—each marker being labeled with a subindex including a letter and/or a numeral—on positions where the marker position calculation unit determines that markers should be displayed, based on subindices input for markers attached to at least two reference positions on the image of the specimen, the reference positions being designated from the marker position input unit.

Also, in accordance with the above charged particle beam irradiation apparatus, when one of the subindices is selected, the marker display unit moves the image of the specimen so that a marker labeled with the selected subindex is displayed on the viewscreen of the image display unit.

Additionally, in the above charged particle beam irradiation apparatus, the marker display unit displays markers on positions on the image of the specimen, determined based on the direction and a pitch between two neighboring positions calculated by using a first reference position and a second reference position on the image of the specimen, the two reference positions being input from the marker position input unit.

On top of that, in accordance with the above charged particle beam irradiation apparatus, the marker display unit displays markers on positions on the image of the specimen, obtained by dividing the interval between the first and second reference positions on the image of the specimen by an input division number, the two reference positions being input from the marker position input unit.

Furthermore, the present invention provides a method of irradiating a specimen with a charged particle beam and displaying an image of the specimen, the image being formed by using charged particles or electromagnetic waves emitted from the specimen irradiated with the charged particle beam, the method comprising the steps of:

displaying a marker on each target position on an image of the specimen, the image being displayed on a viewscreen of the image display unit;

reading in and calculating the position of the displayed image on which the marker is displayed, in the coordinate system for the viewscreen;

moving a specimen stage on which the specimen is held detecting the amount of displacement of the moved specimen stage; and moving the marker to a new position to be located in the coordinate system for the viewscreen based on both the read-in and calculated position and the detected amount of displacement of the moved specimen stage.

Moreover, the present invention also provides a method of irradiating a specimen with a charged particle beam and displaying an image of the specimen, the image being formed by using charged particles or electromagnetic waves emitted from the specimen irradiated with the charged particle beam, the method comprising the steps of:

displaying a marker on each target position on an image of the specimen, the image being displayed on a viewscreen of the image display unit;

reading in and calculating the position of the displayed image on which the marker is displayed, in the coordinate system for the viewscreen;

moving an irradiation region of the specimen, which is irradiated with a charged particle beam;

calculating the amount of displacement of the image of the specimen due to the moving of the irradiation region; and moving the marker to a new position to be located in the coordinate system for the viewscreen based on both the read-in and calculated position and the calculated amount of displacement of the moved image.

By the above-mentioned marker display function according to the present invention, the marker displayed on the designated position in the specimen behaves as if the marker were adhered to the specimen. For example, in the charged particle beam irradiation apparatus according to the present invention, if the position on the image of the specimen, on which the marker is displayed, moves to the outside of the viewscreen, the marker also moves to the outside of the viewscreen along with the position on the image of the specimen, and disappears from the viewscreen. Conversely, if the position on the image of the specimen, on which the marker is to be displayed, moves into the viewscreen of the image display unit, the marker also moves into the viewscreen along with the above position on the image of the specimen, and is displayed on the viewscreen.

Furthermore, the charged particle beam irradiation apparatus and method according to the present invention has an ability to display a marker on each position on the image of the specimen, satisfying the direction and a pitch which are determined based on the positional relationship between designated first and second reference positions to which markers are attached, respectively, and an ability to display a marker on each of the positions on the image of the specimen, the positions being obtained by dividing the interval between the first and second positions on which markers are displayed, by a divisional number input from the input unit, and so on.

Further still, the charged particle beam irradiation apparatus and method according to the present invention has an ability to successively label each of the target positions to be observed on the image of the specimen with a subindex composed of a letter and/or a numeral by automatically changing the subindex. If the subindices are numerals, the markers are automatically labeled with subindices in an increasing order, such as a series of 1, 2, 3 . . . , or in a decreasing order, such as a series of 1, 3, 5, 7 . . . On the other hand, if they are alphabetic letters, the markers are labeled with letters of a series of a, b, c, . . . or a series of z, y, x . . . If the subindices are alphanumeric pairs, the markers are systematically labeled with subindices composed of the pairs by automatically changing the numerals in the subindices in an increasing or decreasing order.

If the markers are labeled with subindices, it is possible to provide an additional function for the charged particle irradiation apparatus, such that by inputting a marker with a subindex, an image of the specimen with the marker with the designated subindex is moved so as to be displayed on the viewscreen of the image display device.

The moving of the image of the specimen can be carried out by moving the specimen stage with the specimen stage drive unit or by moving an irradiation area of the specimen, which is two-dimensionally irradiated with a charged particle beam by the charged particle beam deflection unit.

Furthermore, the displaying of a marker with a designated subindex on the viewscreen of the image display device can be realized by adding a function to the charged particle beam irradiation apparatus, which calculates the necessary amount of movement of the irradiation area based on the present position of the marker with the designated subindex in the coordinate system for the viewscreen, and if the calculated amount of the movement of the irradiation position is within the range in which the irradiation area can be moved by the beam deflection unit, it moves the irradiation area by the calculated amount by using the charged particle beam deflection unit. Otherwise, the displaying of a marker with a designated subindex on the viewscreen can be realized by providing an additional function to control the specimen stage drive circuit so as to move the position of the marker with the designated subindex by the calculated amount.

According to the above function for moving the position of an image of a cell to which a designated marker is attached, it is possible to immediately return back the position of an image of a cell, on which the designated marker is to be displayed but which is outside the viewscreen, onto the viewscreen when a subindex in the target marker is input. Furthermore, markers can be automatically attached to the required positions on the image of the specimen by designating the first and second reference positions with two markers, respectively.

Also, a marker is attached to the position of an image of a desired cell in the specimen and displayed on the viewscreen, by moving a pointer controlled by a pointing device to the desired position and pushing a button switch of the pointer device at the position indicated by the pointer.

In accordance with the present invention, once an operator designates the position of an image of a cell in a specimen, which the operator intends to observe, by using a pointing device which controls a pointer such as a cross or arrow cursor, and attaching a marker with a subindex of a numeral and/or a letter to a desired position designated with the pointer, the attached marker can move along with the position to which the marker is attached when the specimen is moved. Accordingly, if the position on the image of the specimen to which a marker is attached leaves the viewscreen of the image display device, the marker also leaves the viewscreen. Conversely, if the position on the image of the specimen which has been outside the viewscreen returns to the viewscreen of the image display device, the marker is also displayed on the viewscreen. Thus, since a desired position on the image of the specimen can be found by searching or designating a marker attached to the desired position, and it is not necessary to memorize the position, the locating of the desired position can be efficiently performed by an operator. Moreover, if an operator designates two or more reference positions on the image of the specimen by attaching different markers to the respective reference positions, markers can be automatically attached to a plurality of positions on an image of the specimen. Furthermore, each marker can move along with a corresponding one of the plurality of positions to which the markers are attached. Thus, a field to be displayed on the viewscreen on the image of the specimen can be efficiently set even though the specimen is a semiconductor memory in which a number of unit cells are arranged in an orderly manner. In addition, if a subindex of a numeral and/or a letter is included in each marker, the efficiency of setting the displayed view field on the image of the specimen can be further improved.

BRIEF DESCRIPTION OF THE DRAWINGS

FIGS. 3A–7B show examples of displaying an image of a specimen.

FIG. 8 is a flow chart showing operations of the charged particle beam irradiation apparatus and processing executed by the irradiation apparatus of the embodiment.

DETAILED DESCRIPTION OF THE EMBODIMENTS

Hereafter, details of the embodiments according to the present invention will be explained with reference to the drawings. In the embodiments, although a scanning electron microscope is used, the present invention can also be used for other types of charged particle analyzers such as an x-ray micro-analyzer.

Figure 2:
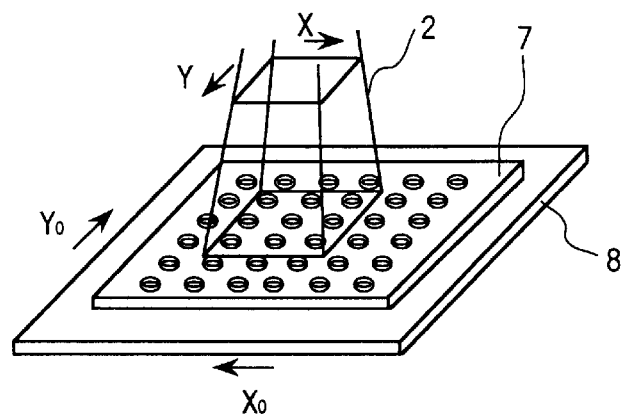
FIG. 2 is an illustration showing a perspective view of a specimen and an area scanned by the scanning electron microscope.
Figure 3A:
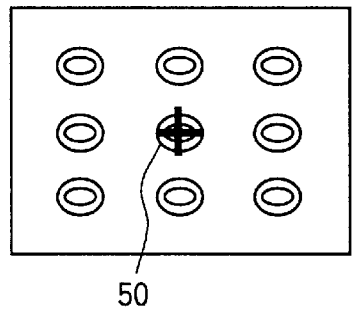
Figure 3B:
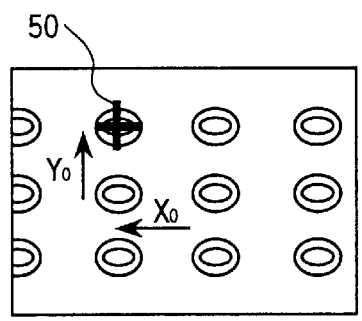

The function of the scanning electron microscope used in the present invention is conceptually explained below with reference to FIG. 2, and FIGS. 3A and 3B. FIG. 2 is an illustration showing both a perspective view of a specimen 7, for example, a semiconductor memory, in which a large number of unit cells (hereafter, simply referred to as cells) is arranged in a latticework, and an area of the specimen 7, which is two-dimensionally scanned by the scanning electron microscope. The specimen 7 is held on a specimen stage 8 and can be moved by moving the specimen stage 8. FIGS. 3A and 3B show examples of displaying an image of the specimen 7, which is formed by using secondary electrons generated by the scanning of electrons performed by the scanning electron microscope.

In the simplest embodiment according to the present invention, which is shown in FIGS. 3A and 3B, when an image of a cell in the specimen 7 (also referred to as an cell image) comes on the viewscreen of the image display unit, a marker 50 is attached as a sign post to the cell image by using an input means as shown in FIG. 3A. Afterward, if the specimen stage 8 is moved in the direction indicated by the arrow shown in FIG. 2, the attached marker 50 is also moved following the movement of the cell in the specimen 7. As a matter of course, it is necessary to detect the amount of the movement of the specimen stage 8 by using a detection means and to estimate the amount of the movement of the cell image based on the detected amount of the movement of the specimen stage 8 and the magnification (M) of the displayed image. Here, expressing the amount of the movement of the specimen stage 8 by the coordinates (X0, Y0) in the two-dimensional rectangular-coordinate system, the displacement amount of the cell image displayed on the viewscreen of the image display unit is expressed by the following equations (1).

$$XD = M \times X0$$

$$YD = M \times Y0 \tag{1}$$

Therefore, when the specimen stage 8 is moved by X0 and Y0 in the X and Y directions, respectively, by moving the marker 50 attached to the cell image by the respective quantities of XD and YD in the X and Y directions, which are calculated by the equations (1), the marker 50 is moved along with the cell image on the viewscreen of the image display unit.

Figure 4:
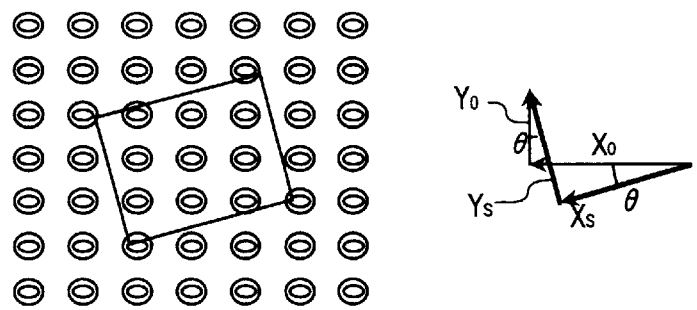

In the examples shown in FIG. 2 and FIGS. 3A and 3B, since the x and Y directions in which the specimen stage 8 can be moved are the same as those in the electron beam scanning of the specimen 7, the amount of the movement of the marker 50 can be calculated by using the equations (1). However, it actually often occurs that the X and Y directions in which the specimen stage 8 can be moved are different from those in the electron beam scanning of the specimen 7 as shown in FIG. 4. In this case, letting the angle between the coordinate system in the movement of the specimen stage 8 and that in the electron beam scanning operation be represented by θ, the displacement amount of the cell image is obtained by the following equations (2).

That is, the displacement components XS and YS of the specimen stage 8 in the coordinate system of the two-dimensional electron beam scanning operation are expressed as follows.

$$XS = X0 \cos \theta - Y0 \sin \theta$$

$$YS = X0 \sin \theta + Y0 \cos \theta \tag{2}$$

Furthermore, by multiplying XS and YS by the significance M, the displacement components XD and YD of the cell image displayed on the viewscreen of the image display unit can be obtained by the following equations (3). Thus, when the specimen stage 8 is moved by X0 and Y0 in the X and Y directions, respectively, by moving the marker attached to the cell image by the respective quantities of XD and YD in the X and Y directions, which are calculated by the equations (3), the marker 50 is moved along with the cell image to which the marker 50 was attached, on the viewscreen of the image display unit.

$$XD = M \times XS$$

$$YD = M \times YS \tag{3}$$

In the above-explained case, the image of a cell in the specimen 7 is moved by moving the specimen stage 8. On the other hand, an electron beam deflection unit for moving the field of the viewscreen by moving an area in the specimen 7, irradiated with an electron beam, is usually incorporated into a scanning electron microscope. When the field of the viewscreen is changed by the electron beam deflection unit, the marker 50 needs to be moved along with the cell image, following the movement of the cell. A method of changing the field of the viewscreen, which is performed by the electron beam deflection unit, is explained below with reference to FIG. 5.

FIG. 5 shows an example of a displayed image of the specimen 7, and also illustrates the displacement amount of the displayed image, the displacement being performed by the electron beam deflection unit. In the following, the displacement amount of the displayed image is explained by assuming that the X-Y coordinate system of the electron beam scanning performed by the electron beam deflection unit is the same as that of the electron beam deflection unit. It is because the coordinate system is often made equal in both the electron beam deflection and the electron beam scanning by winding two coils for these beam scanning and deflection operations on the same bobbin. Furthermore, it is assumed that the maximum value of a digital value for a control amount to deflect an electron beam, which is input to the electron beam deflection unit, is "255". It is because a D/A converter of 8 bits or 12 bits has been currently used in control circuits, and a D/A converter of 8 bits is adopted in this embodiment. In the general conversion of a D/A converter, if expressing the maximum deflection quantities of an electron beam in the respective X and Y directions as $X_{e\text{-}max}$ and $Y_{e\text{-}max}$ according to the normalized maximum input value "+1" which corresponds to the input digital control amount "255", the deflection quantities XSE and YSE according to the digital control values $X_e$ and $Y_e$ input to the D/A converter are obtained by the following equations (4). Here, the respective $X_3$ and $Y_e$ have a value of 1–255.

$$XSE=(X_e \times X_{e\text{-}max})/256$$

$$YSE=(Y_e \times Y_{e\text{-}max})/256 \qquad (4)$$

By taking into consideration that the direction of the movement of the cell image, displayed on the viewscreen of the image display unit, is the reverse of that of the deflection of the field scanned with an electron beam, the above quantities XSE and YSE are converted to the quantities XDE and YDE expressing an actual displacement amount of the cell image displayed on the viewscreen as follows.

$$XDE=-M \times XSE \quad YDE=-M \times YSE \qquad (5)$$

Accordingly, when the digital control values $X_e$ and $Y_e$ in the X and Y directions are input to the electron beam deflection unit, by moving the marker attached to the cell image by the quantities of XDE and YDE which are calculated by the equations (5) in the X and Y directions, respectively, the marker 50 is moved along with the cell image on the viewscreen of the image display unit.

Furthermore, the movement of the marker 50 due to changing of the magnification is explained with reference to FIGS. 6A and 6B. Here, FIGS. 6A and 6B show examples of displaying the image of the specimen 7 at two different levels of magnification, and displaying the movement of the position of the marker 50 on the image displayed on the viewscreen.

Now, as indicated in FIG. 6A, at the magnification of M0, the marker 50 is displayed at the position apart from the central point of the viewscreen of the image display unit by a distance of $X_{M0}$ and $Y_{M0}$. On the other hand, as indicated in FIG. 6B, at the magnification of M1, the marker 50 is displayed at the position apart from the central point of the viewscreen of the image display unit by a distance of $X_{M1}$ and $Y_{M1}$. Thus, the relationship between the positions ($X_{M0}$, $Y_{M0}$) and ($X_{M1}$, $Y_{M1}$) is expressed by the following equations (6).

$$X_{M1}=(M1/M0) \times X_{M0} \quad Y_{M1}=(M1/M0) \times Y_{M0} \qquad (6)$$

Therefore, when the magnification is changed from M0 to M1, by moving the marker 50 attached to the cell image according to the equations (6) in the X and Y directions, the marker 50 is moved along with the cell image on the viewscreen of the image display unit.

The fundamental concept of the present invention has been explained above. In addition, a method of successively attaching a plurality of markers to positions on the image of the specimen 7 displayed on the viewscreen of the image display unit by a marker display rule designated by an operator is explained below with reference to FIGS. 7A and 7B. To begin with, as shown in FIG. 7A, the first reference marker 51 is attached to the first reference position on the image of the specimen 7. Next, as shown in FIG. 7B, the second reference marker 52 is attached to the second reference position on the image so as to designate both the direction of a series of the successively attached markers and the pitch between two successive markers. By the above method, a series of the successive markers 51, 52, and soon, can automatically be attached to pertinent cell images of in the image of the specimen 7. Afterward, if the image of the specimen 7 is moved to the left as shown in FIG. 7B, the markers 51 and 52 also move to the left along with the positions to which the markers 51 and 52 are attached, and if the position to which the marker 53 is attached comes onto the viewscreen, the marker 53 is automatically displayed on this position.

Moreover, in this embodiment shown in FIGS. 7A and 7B, the markers 51 and 52 are input and labeled with subindices of the numerals 1 and 2, respectively. By inputting the subindices 1 and 2, markers after the marker 52 are automatically labeled with numerals in an increasing order. Conversely, if the markers 51 and 52 are input and labeled with the numerals 2 and 1, respectively, all subsequent markers are labeled with numerals in a decreasing order. Also, the markers can be labeled with a series of letters (for example, a,b,c, . . . ), or subindices composed of alphanumeric pairs (for example, X1, X2, X3, . . . ). As mentioned above, by labeling the markers with subindices such as numerals, since target cell to be observed in the specimen 7 can be located with the help of the subindices, it becomes easier to search the target cell in the specimen 7.

Figure 1:
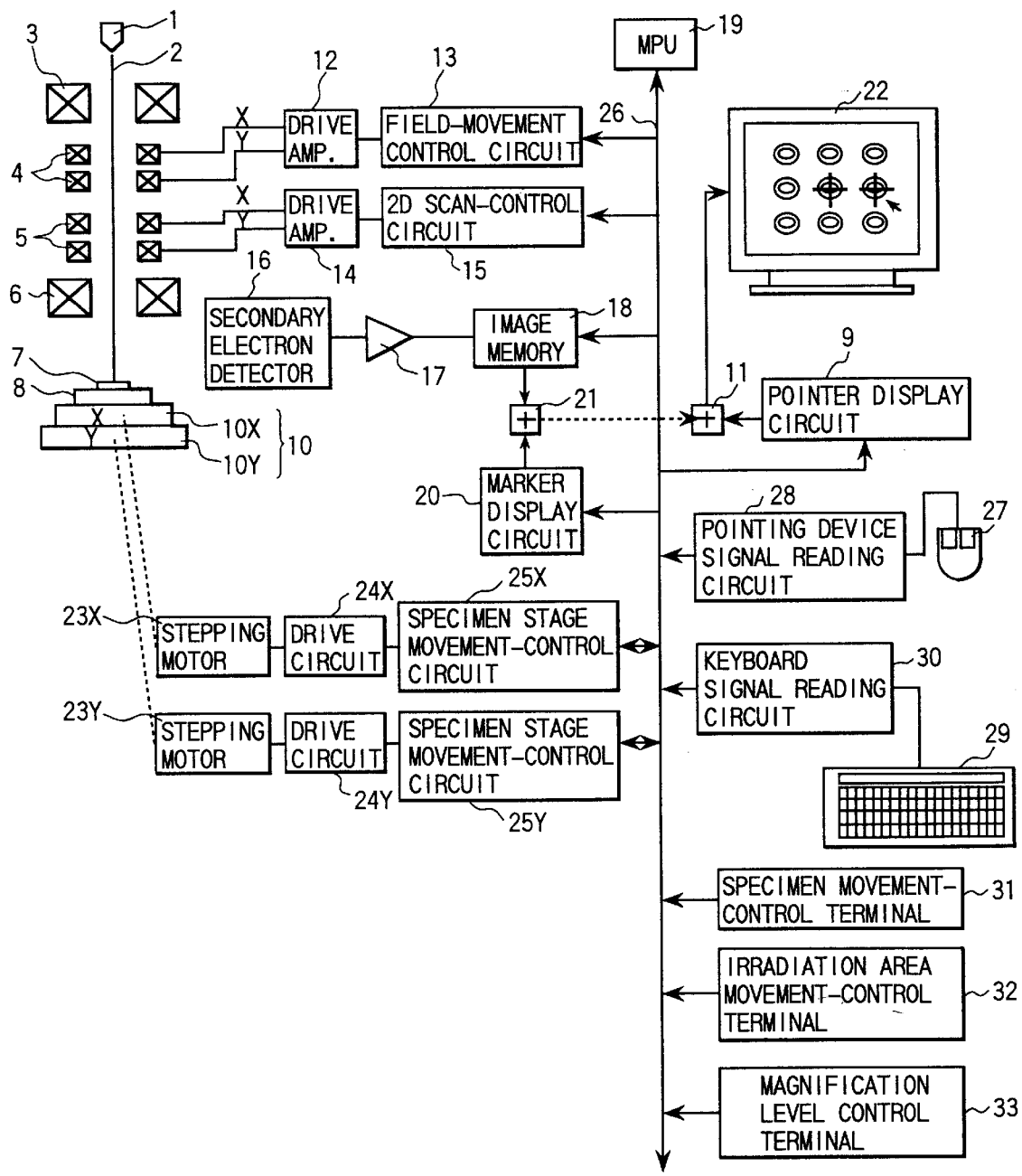
FIG. 1 is a schematic diagram showing the composition of a charged particle beam irradiation apparatus using a scanning electron microscope, of an embodiment according to the present invention.

FIG. 1 is a schematic diagram showing the composition of a charger particle beam.irradiation apparatus using a scanning electron microscope, of an embodiment according to the present invention. An electron beam 2 emitted from an electron gun 1 is focused on the specimen 7 by a convergence lens 6 and an objective lens 3. Also, the specimen 7 is two-dimensionally scanned with the electron beam 2 by using a deflection coil 5. Further, the secondary electrons emitted from the specimen 7 are detected and converted to image signals by a secondary electron detector 16, and the image signals are then amplified by an amplifier 17. Furthermore, the amplified image signals are sent to an image memory 18. The two-dimensional scan of the specimen 7 is performed with sawtooth wave signals generated by a two-dimensional scan-control circuit 15, and the amplitude of the sawtooth wave, to which the magnification of the scanning electron microscope is inversely proportional, is controlled by a command signal sent from a microprocessor (MPU) 19. The sawtooth wave signals are converted to current signals via a drive amplifier 14, and the converted current signals flow in the deflection coil 5. The image data of the specimen 7, which are stored in the image memory 18, are read out asynchronously to the two-dimensional scan of the specimen 7, and are displayed on the image display unit 22 as an image of the specimen 7. Also, an input operation for changing the magnification is performed via a magnification level control terminal 33.

The specimen 7 is mounted on the specimen stage 8, and the specimen stage 8 can be two-dimensionally moved by the specimen stage driving mechanism 10. The specimen stage driving mechanism 10 is composed of the specimen stage driving device 10X and the specimen stage driving device 10Y which are driven by stepping motors 23X and 23Y, respectively. The stepping motors 23X and 23Y are further driven by drive circuits 24X and 24Y based on drive pulse signals generated by specimen stage movement-control circuits 25X and 25Y. Also, the specimen stage movement-control circuits 25X and 25Y detect the displacement quantities of the movement of the specimen stage 8 in the X and Y directions carried out by the specimen stage driving devices 10X and 10Y by counting the number of the pulse signals sent to the drive circuits 24X and 24Y. The input operation for moving the specimen 7 is carried out by using a specimen movement-control terminal 31, and the displacement quantities in the X and Y directions, which are input by this operation, are sent to the MPU 19. Further, the movement of the specimen 7 is controlled based on command signals for designating the displacement quantities of the movement of the specimen 7 in the X and Y directions, which are sent from the MPU 19 to the specimen stage movement-control circuits 25X and 25Y. In addition, the deflection coil 4 for moving the field of the viewscreen is provided to move the field of the viewscreen by moving the scan area of the specimen 7, which is scanned with an electron beam. This deflection coil 4 is controlled by a field movement-control circuit 13 via a drive amplifier 12.

In this embodiment, a pointing device 27 is used for designating an optional position on the image displayed on the image display unit 22. The display of a pointer such as an arrow mark, which is displayed on the viewscreen of the image display unit 22, is carried out based on pointer display signals generated by a pointer display circuit 9, and the pointer display signals are superimposed on image display signals in an image addition circuit 11. Afterward, the superimposed signals are displayed on the image display unit 22. Also, the moving of the pointer is performed by decoding signals sent from the pointing device 27 with a pointing device signal reading circuit 28, and sending signals for designating the position of the pointer to the pointer display circuit 9. Moreover, numerals and/or letters for subindices of markers are input with a keyboard 29, and the input numerals and/or letters are further decoded by a keyboard signal reading circuit 30. Furthermore, the charged particle beam irradiation apparatus using the scanning electron microscope, according to the present invention, includes a marker display circuit 20 for generating signals to display a marker attached to a position on the image of the specimen 7 and an image addition circuit 21 for superimposing the signals output from the marker display circuit 20 on the image signals of the specimen 7. All the above circuits are controlled by the MPU 19 via a bus 26, and calculations necessary for the operations of these circuits are executed by the MPU 19.

In the following, processing performed by the above charged particle beam irradiation apparatus using the scanning electron microscope and operations for the above charged particle beam irradiation apparatus will be explained with reference to FIG. 8. FIG. 8 is a flow chart showing the operations of the charged particle beam irradiation apparatus and the processing executed by the apparatus of the embodiment. To begin with, in step S11, the specimen 7 is moved by using the specimen movement-control terminal 31. If the first reference position on the image of the specimen 7 appears on the viewscreen, in step S12, by using the pointing device 27, the pointer is moved to the first reference position to which a marker is attached. Afterward, in step S13, the position of the marker is designated by pressing a button on the pointing device 27. Further, the marker display circuit 20, which has received signals for designating the position of the marker, generates signals for displaying the marker, and these marker display signals are superimposed on image signals of the specimen 7 by the image addition circuit 21. Furthermore, the marker 51 which is a cross cursor in this embodiment is attached to the first reference position on the image displayed on the viewscreen by displaying the superimposed signals.

Subsequently, in step S14, a numeral as a subindex with which the marker 51 is labeled is input from the keyboard 29. In step S15, if the input numeral is "1," the marker display circuit 20 displays the marker 51 with the subindex "1" attached to the side of this marker 51. Next, the second reference position is also designated to attach markers to successive target positions to be observed. The second reference position on the image of the specimen 7 sometimes is not shown on the viewscreen along with the first reference position. If the second reference position is not shown on the viewscreen along with the first reference position, in step S16, the field of the display is shifted to another field by operating the specimen stage driving mechanism 10. In FIG. 7A, for the simplicity of explanation, it is assumed that both the first and second reference positions exist on the same viewscreen, and that the second one neighbors the first one. In step S17, the pointer is moved to the second reference position by using the pointing device 27, and in step S19, the marker 52 is attached to the second reference position by pressing a button of the pointing device 27. At the same time, in step S19, a subindex of a numeral with which the marker 52 is labeled is also input. In this example, a numeral "2" is input as the subindex for the marker 52.

In step S20, when acknowledging the inputting of the subindex for the marker 52, the MPU 19 sends the marker display circuit 20 an instruction signal for displaying the numeral "2" on the side of the marker 52, and the marker display circuit 20 which has received the instruction signal displays the subindex "2" on the side of the marker 52. Further, in step S21, the MPU 19 calculates the direction and the pitch necessary to successively display markers on the other target positions, based on the calculated direction and pitch. Furthermore, in step S22, the MPU 19 automatically calculates the increment or decrement width in a series of subindices with which the markers to be attached to the target positions are labeled by using the subindices of the numerals input for the markers 51 and 52. That is, the increment or decrement width in the series of the subindices is obtained based on the difference between the two input numerals. Afterward, in step S23, the MPU 19 determines what scope in the images of the target cells to which the markers have been attached can be displayed in the present display field, and it successively displays the markers attached to the images in the determined scope.

Next, in step S24, if the specimen stage 8 is moved to observe an image of another target cell in the specimen 7, the MPU 19 calculates the displacement amount of the image of the specimen 7 based on the detected amount of the movement of the specimen stage 8. Further, in step S25, it is determined whether or not a marker attached to each cell image displayed in the renewed field of the viewscreen was being displayed in the previous field of the viewscreen. If some of the markers checked in step S25 were being displayed in the previous field, their present positions on the image of the specimen 7 are calculated in step S26. Furthermore, in step S27, it is determined whether or not these present calculated positions exist inside the renewed field. If these present calculated positions exist inside the renewed field, in step S28, data about these positions are sent to the marker display circuit 20, and the marker display circuit 20 displays the predetermined markers on these positions. Otherwise, in step S29, the circuit 20 does not execute the processing of displaying markers on these positions, and the process returns to step S24. Conversely, in step S25, if some of the markers determined in step S25 were being displayed in the previous field, in step S30, their present positions on the image of the specimen are also calculated. Furthermore, in step S31, it is determined whether or not these calculated present positions exist inside the renewed field. If these calculated present positions exist inside the renewed field, in step S32, the predetermined markers are displayed on these position. Otherwise, in step S33, the process of displaying markers on these positions is not executed, and the process returns to step S24.

As shown in the flow chart in FIG. 8, each marker which has been designated to a cell image can move along with the specimen 7. Moreover, when cell images other than the images at the first and second reference positions to which the markers 51 and 52 are attached come onto the viewscreen, a series of markers 53, 54, . . . are successively displayed on their respective objective positions, and subindices of numerals designated in an increasing or decreasing order are also displayed on the sides of the respective markers as shown in FIG. 7B. In the example shown in FIGS. 7A and 7B, the markers 51 and 52 are displayed on the first and second reference positions of cell images adjacent to each other, and the markers 51 and 52 are further labeled with subindices of numerals "1" and "2". Accordingly, if a marker 53 is displayed on the cell image adjacent to the second reference position of the cell image on which the marker 52 is displayed, the marker 53 is labeled with a subindex of the numeral "3." As a matter of course, if the marker 52 displayed on the second reference position of the cell image two cell images away from the first reference position on which the marker 51 with the subindex "1" is displayed is labeled with a subindex "4," a series of markers is displayed on cell images on the line connecting the first and second reference positions in every three cell images, and the series of the respective markers is labeled with a series of subindices "1," "4," "7," . . .

The scanning electron microscope in the charged particle beam irradiation apparatus shown in FIG. 1 includes the deflection coil 4 to move the field of the viewscreen by shifting the scan area of the specimen 7, which is scanned with an electron beam. The deflection coil 4 is controlled by the field movement-control circuit 13 via the drive amplifier 12, according to instruction signals for the movement of the field sent from the MPU 19, which has received operation signals input from the irradiation area movement-control terminal 32. The amount of the movement of a cell image due to the movement of the irradiation position is calculated based on the equations (5) by the MPU 19, and this calculated amount of the movement of the cell image is sent to the marker display circuit 20. The whole process executed by the charged particle beam irradiation apparatus and operations of this apparatus for moving the field of the viewscreen by shifting the irradiation area is similar to that of moving the field of the viewscreen by moving the specimen 7. Therefore, explanation of this process is omitted. Also, according to this flow, a marker attached to each cell image on the image of the specimen 7 moves along with the cell image, following the movement of the corresponding cell in the specimen 7, and if a cell image which was outside the viewscreen comes onto the viewscreen, a predetermined marker is displayed on this cell image.

Figure 9:
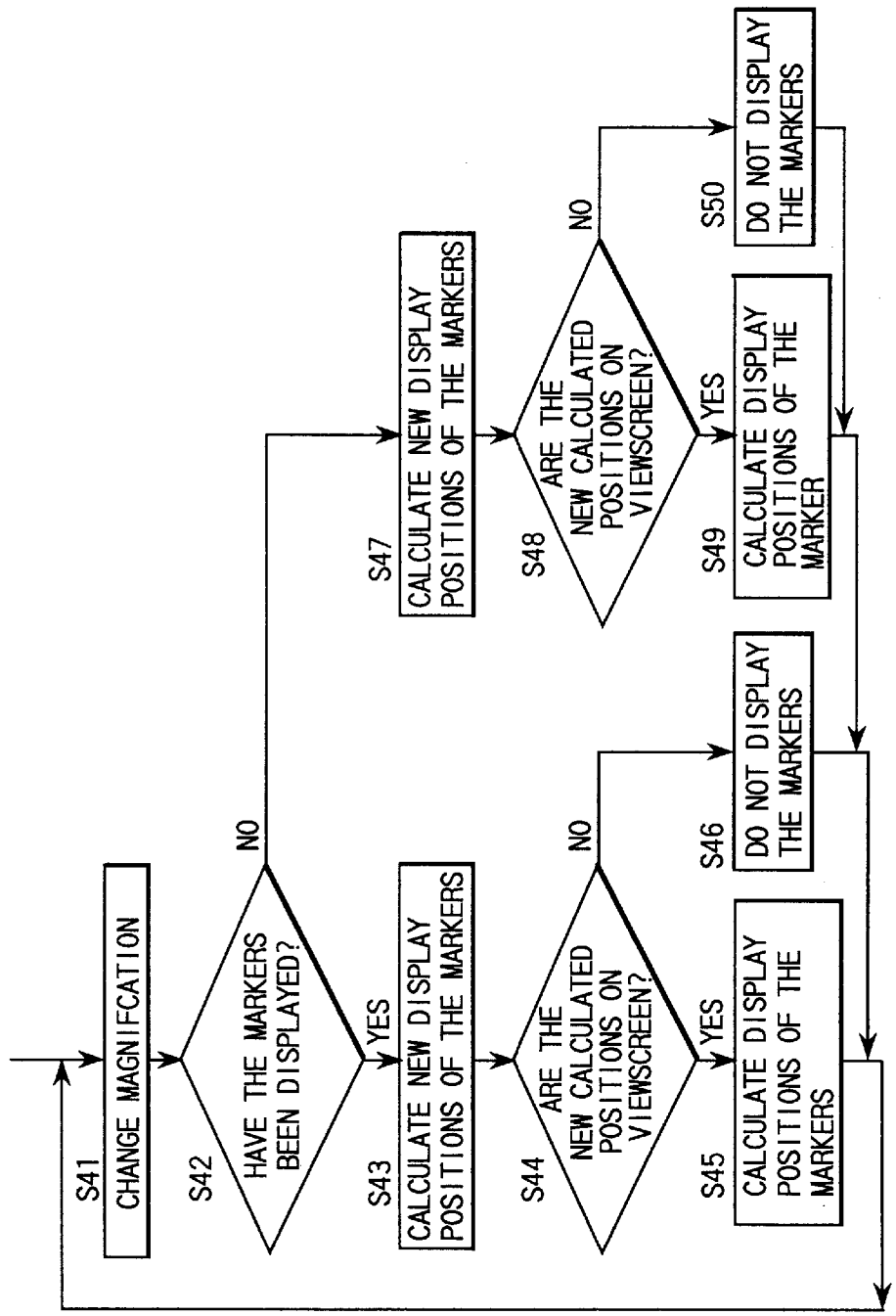
FIG. 9 is a flow chart showing processing executed by the charged particle beam irradiation apparatus of the embodiment when the magnification of the scanning electron microscope is increased.

In the scanning electron microscope, its magnification is usually altered by changing the scan area of the specimen 7, which is scanned with an electron beam. In the following, a method of moving a marker attached to a cell image by changing the magnification will be explained. FIG. 9 is a flow chart showing processing executed by the charged particle beam irradiation apparatus when the magnification of the scanning electron microscope is increased. This flow chart is made assuming that markers are already attached to images of target cells to be observed.

Here, in the first step S41 of this flow chart, the changing of the magnification is carried out by using the magnification level control terminal 33.

The MPU 19, which has received the input operation signals for changing the magnification, sends an instruction signal to change the magnification to the two-dimensional scan-control circuit 15, and the two-dimensional scan-control circuit 15 changes the magnification by changing the amplitude of the electron beam scanning, which determines the scan area of the specimen 7. At the same time, in step S42, the MPU 19 determines whether or not any marker has been displayed on the previous viewscreen. If at least one marker has been displayed, in step S43, a new display position for this marker is estimated as explained regarding the flowchart shown in FIG. 8. Further, in step S44, it is determined whether or not the new display position of this marker exists inside the renewed field of the viewscreen. If the new display position is inside the renewed field of the viewscreen, the MPU 19 sends the data for this new position to the marker display circuit 20, and the circuit 20 displays the predetermined marker on the new display position. Conversely, if the new display position of this marker goes outside the present viewscreen, in step S46, the process of displaying a marker is not performed, and the process returns to step S41.

On the other hand, if any marker has not been displayed on the previous viewscreen, new display positions of the predetermined markers which were already attached to the cell images are estimated again in step S47. Furthermore, in step S48, it is determined whether or not any one of the new estimated new display positions of the markers have come onto the renewed field of the viewscreen. If some of the estimated new position have come onto the viewscreen, in step S49, the predetermined marker is displayed on the new position. Conversely, if any one of the estimated new positions has come onto the viewscreen, in step S50, the process of displaying a marker is not executed.

According to the above-explained flow charts shown in FIG. 8 and FIG. 9, the markers successively attached to cell images can be moved along with the specimen 7 or the change of the magnification. The process then returns to step S41.

Figure 10A:
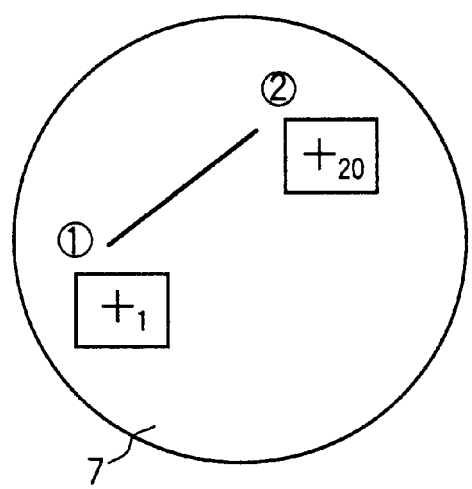
FIGS. 10A–15B show examples of displaying markers attached to images of target cells of a specimen.
Figure 10B:
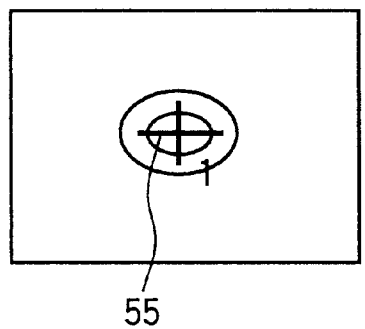
Figure 10C:
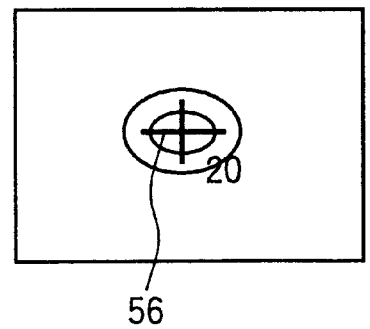
Figure 11:
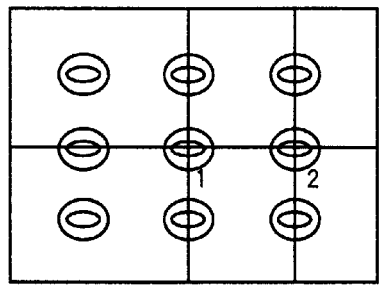

In the above embodiment, to successively attach markers to cell images, the second reference position is designated as the position of a cell image next to the cell image of which the display position is designated as the first reference position. If the number of cell images existing from the first one to the last one is known in advance, the following method of successively attaching markers to those cell images can be used. FIGS. 10A–10C are illustrations for explaining this method.

First, the specimen 7 is moved so that the first reference position ① on the image of the specimen 7 comes onto the viewscreen of the image display unit 22 as shown in FIG, 10A. In this state, as shown in FIG. 10B, the pointer is moved to this first reference position to which a marker is attached, and a marker 55 is attached to this position. At the same time, a subindex ("1" in the example shown in FIG. 10B) is input, and the marker 55 is labeled with this subindex "1." This process is the same as that in the above embodiments shown in FIGS. 6A and 6B or FIGS. 7A and 7B. Afterward, the specimen 7 is further moved so that the second reference position ② on the image of the specimen 7 comes onto the viewscreen of the image display unit 22 as shown in FIG. 10A. Furthermore, as shown in FIG. 10C, the pointer is moved to this second reference position to which a marker is attached, and a marker 56 is attached to this position. Also, a subindex ("20" in this example shown in FIG. 10C) is input, and the marker 55 is labeled with this subindex "20."

The subindex "20" is the number of the final cell image, and the difference between the number "20" of the final subindex and the number "1" of the first subindex indicates the division number of the interval between the first and second (final) reference positions. Based on the input subindices for the first and final reference positions, and the coordinates of these positions, the MPU 19 estimates each position to which a marker is attached between the first and final positions. Further, the MPU 19 sends the marker display circuit 20 an instruction signal such that pairs of a marker and its subindex are displayed on only some of the estimated positions on the viewscreen. After the display of these markers and their subindices is completed, if the specimen 7 is moved, or the magnification is changed, the displayed markers and their subindices can be moved along with the cell images to which the markers are attached by the same processing as that carried out in the aforementioned embodiments. By the above-mentioned method, a convenient and efficient function for searching each of the cell images between the first and final positions can be realized.

Figure 12A:
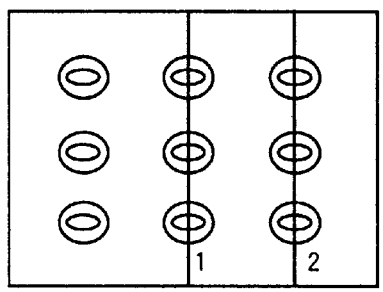
Figure 12B:
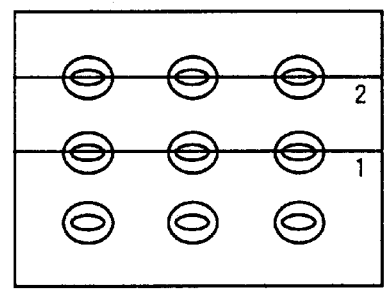

In the above embodiments, a cross mark is used as a marker. However, another type of marker can be also used. FIGS. 11–13B show examples of marker display of another embodiment. In the example shown in FIG. 11, a cross line is used as a marker, and the visibility of a cross line is excellent. Furthermore, a horizontal line or a vertical line alone can be also used as a marker, depending on the object of observation for the specimen 7. FIGS. 12A and 12B are examples of marker display, in which either a vertical line marker or a horizontal line marker is used, respectively. For the above marker display, the selection of either a vertical line marker or a horizontal line marker is input in advance from an input device such as the keyboard 9 so that either a vertical line marker or a horizontal line marker alone is attached to the display positions on the image of each cell as shown in FIG. 12A or FIG. 12B. Also, it is possible to label each line marker with a subindex as shown in FIG. 12A or FIG. 12B.

Figure 13A:
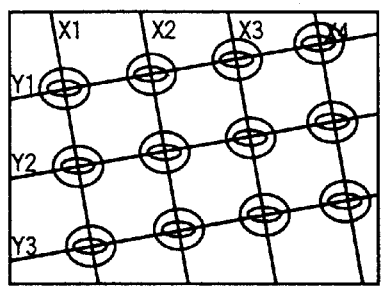
Figure 13B:
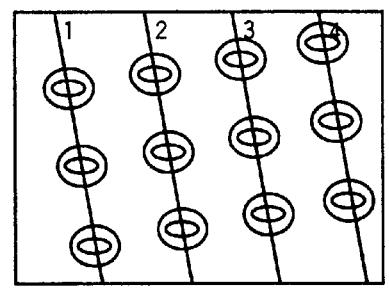

Moreover, if markers are successively displayed, as shown in FIG. 13A, it is also possible to successively display each marker as a pair of lines perpendicularly intersecting each other on the cell images to which markers should be attached. Furthermore, as explained for FIGS. 12A and 12B, if one-line marker displaying is effective for the object of observation for the specimen 7, lines of only one direction of cross line markers can be displayed. FIG. 13B shows an example in which only vertical lines of cross line markers are displayed as markers.

Figure 14A:
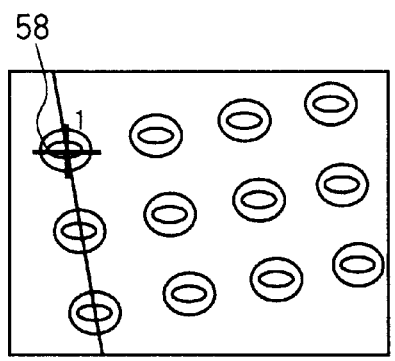
Figure 14B:
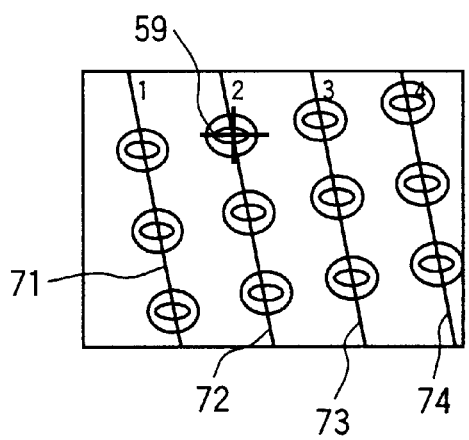
Figure 14C:
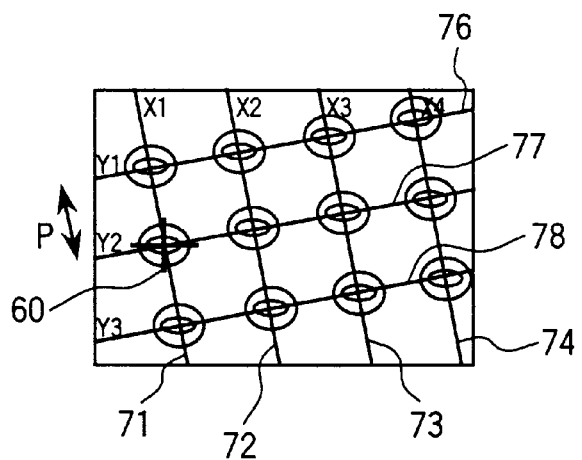
Figure 15A:
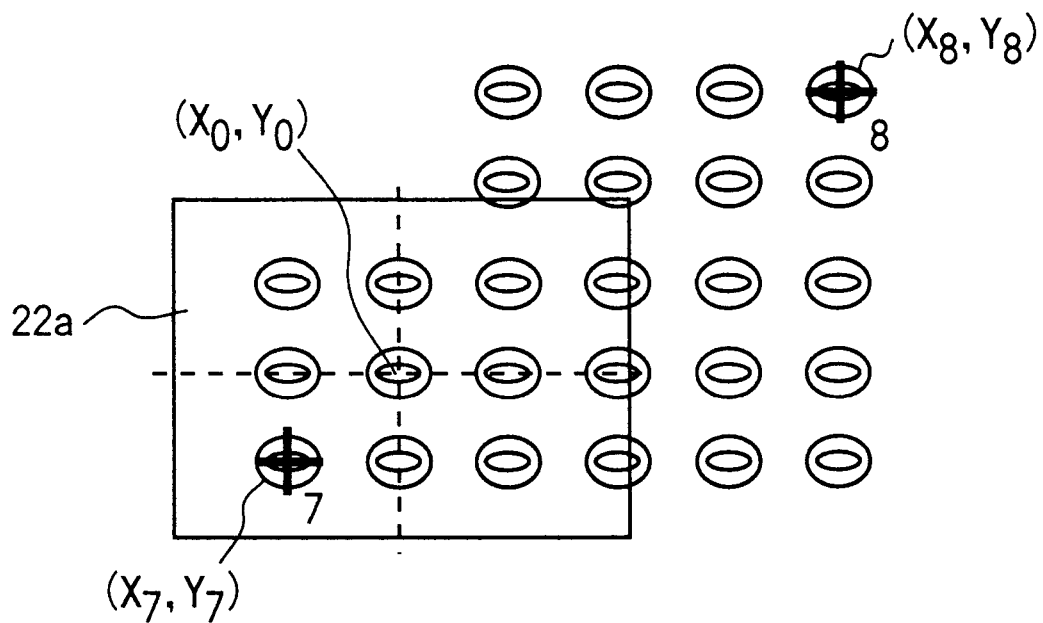
Figure 15B:
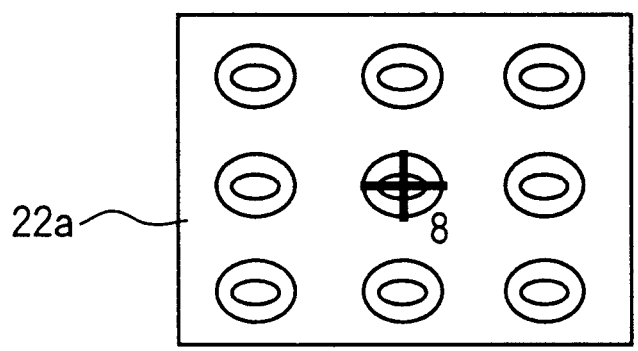

FIGS. 14A–14C are examples of marker display, in which the procedure of successively displaying vertical line markers as shown in FIGS. 13A and 13B in one direction is used. To begin with, as shown in FIG. 14A, the first reference position 58 is designated in the same manner as that in the above-mentioned embodiments. Next, the second reference position 59 is also designated by moving the pointer to the position 59. Subsequently, vertical line markers 71, 72, 73, and 74 are displayed perpendicular to the line connecting the positions 58 and 59 on the viewscreen of the image display unit 22. Moreover, when the completion of the input operations is input from the keyboard 29, the MPU 19 determines that a line in the designated direction of each cross-marker is to be attached to a corresponding position as a marker, and further displays line-markers perpendicular to the direction connecting the positions 58 and 59 as shown in 14B. Furthermore, if the third reference position 60 is designated as shown in FIG. 14C, line markers 76, 77, and 78 perpendicular to the already displayed line markers 71, 72, 73, and 74 are displayed with a pitch P shown in FIG. 14C. By using the line markers shown in FIG. 11, FIGS. 12A and 12B, and FIGS. 13A and 13B, it is possible to deal with the image of the specimen 7 as if graduations are drawn on the image. FIGS. 15A and 15B show an example of search for a cell image, which is performed by using markers, and in this example, by inputting the subindex of a numeral and/or a letter with which a marker attached to the target cell image to be searched is labeled, the target cell image designated by the input subindex for the marker can immediately be seen on the viewscreen. Also, it is assumed that the markers are labeled with subindices of numerals.

Now, in FIG. 15A, a cell neighboring a marker labeled with a subindex of "7" is being observed. As a matter of course, an operator can see only cell images displayed inside the field of the viewscreen 22a, and cannot see cell images other than these images. If the operator intends to observe a cell image with a marker labeled with a subindex "8," it is possible to locate this cell image by gradually moving the specimen 7 with the specimen movement-control terminal 31 so that the image of this cell comes inside the field 22a of the viewscreen. However, in this embodiment, the subindex "8" with which the marker attached to this cell is labeled is input from the keyboard 29. When the MPU 19 receives an input signal for the subindex "8," the MPU 19 estimates the distance between the positions in the presently observed cell images and the cell image to which the marker labeled with the subindex "8" is attached. If the displacement amount of the cell image, which corresponds to this estimated distance, is within a range that can be attained by a shift of the field of the viewscreen, performed by the deflection coil 4, then this displacement amount of the movement of the cell image is sent to the field movement-control circuit 13. Otherwise, this displacement amount of the image is sent to the specimen stage movement-control circuits 25X and 25Y, and the field of the viewscreen is moved by this amount by moving the specimen stage 8. Thus, the next cell image to be observed is brought onto the viewscreen.

In order to implement the above marker control, markers attached to cell images are managed based on the coordinates of the positions of the cell images to which the markers are attached. Now, letting the coordinates of the cell image to be presently observed and the cell image to be next observed (X0, Y0) and (X8, Y8), respectively, the displacement amount of the field—that is, (X0–X8, Y0–Y8)—is sent to the field movement-control circuit 13 or the specimen stage movement-control circuits 25X and 25Y if it is intended that the position of the cell image whose coordinates are (X8, Y8) be shifted to the position (X0, Y0). Subsequently, the image display shown in FIG. 15B is quickly obtained. The position (X8, Y8) is designated by inputting the subindex "8," with which the marker attached to the cell image which is positioned at (X8, Y8) is labeled, from the keyboard 29.

In accordance with the present invention, even if a large number of cells are arranged in an orderly manner in the specimen 7, an operator can easily search an image of a cell to be observed, by efficiently moving the field of the viewscreen, which greatly reduces the operator'work of counting the number of cells and memorizing reference positions of cells and the numbers counted.

What is claimed is:

1. A charged particle beam irradiation apparatus comprising:

a specimen stage for holding a specimen, a specimen stage drive unit for moving said specimen stage;

a detector for detecting the amount of displacement of said moved specimen stage;

a charged particle beam optical unit for irradiating said specimen with a charged particle beam;

an image display unit for displaying an image of said specimen, said image being formed by using charged particles or electromagnetic waves emitted from said specimen irradiated with said charged particle beam;

a marker display unit for displaying a marker on each target position on an image of said specimen, said image being displayed on a viewscreen of the image display unit;

a marker position input unit for designating reference positions on said image of said specimen, on which respective markers are displayed; and a marker position calculation unit for calculating said position on which each marker is displayed on said image of said specimen on said viewscreen of said image display unit;

wherein, when said specimen stage is moved, said position on said image of said specimen, on which each marker is to be displayed, is also moved based on both said calculated position of each marker, which has been calculated by said position calculation unit, and the amount of displacement of said moved specimen stage, on said amount of displacement being detected by said detector.

2. A charged particle beam irradiation apparatus according to claim 1, wherein said marker display unit displays a marker on the position on said image of said specimen, corresponding to the same position in the coordinate system for said specimen, even if said image of said specimen is moved by moving said specimen stage.

3. A charged particle beam irradiation apparatus according to claim 1, wherein first and second reference positions on said image of said specimen are input by said marker position input unit, and said marker display unit displays markers on positions on said image of said specimen, said positions being determined based on the direction and pitch between an adjacent pair of said positions, which are obtained by using said first and second reference positions.

4. A charged particle beam irradiation apparatus according to claim 1, wherein first and second reference positions on said image of said specimen are input by said marker position input unit, and said marker display unit displays markers on positions on said image of said specimen, said positions being obtained by dividing the interval between said first and second reference positions on said image of said specimen by an input division number.

5. A charged particle beam irradiation apparatus comprising:

a specimen stage for holding a specimen, a specimen stage drive unit for moving said specimen stage;

a detector for detecting the amount of displacement of said moved specimen stage;

a charged particle beam optical unit for irradiating said specimen with a charged particle beam;

an image display unit for displaying an image of said specimen, said image being formed by using charged particles or electromagnetic waves emitted from said specimen irradiated with said charged particle beam;

a marker display unit for displaying a marker on each target position on an image of said specimen, said image being displayed on a viewscreen of the image display unit;

a marker position input unit for designating reference positions on said image of said specimen, on which respective markers are displayed; and a marker position calculation unit for calculating said position on which each marker is displayed on said image of said specimen on said viewscreen of said image display unit;

wherein, when said specimen stage is moved, said position on said image of said specimen, on which each marker is to be displayed, is also moved based on both said calculated position of each marker, which has been calculated by said position calculation unit, and the amount of displacement of said moved specimen stage, on said amount of displacement being detected by said detector, and wherein said marker display unit automatically displays markers—each marker being labeled with a subindex including a letter and/or a numeral—on positions on which said marker position calculation unit determines that markers should be displayed based on subindices input for markers attached to at least two reference positions on said image of said specimen, said reference positions being designated by said marker position input unit by successively changing each of said subindices for said markers.

6. A charged particle beam irradiation apparatus according to claim 5, wherein when one of said subindices is selected, said marker display unit moves said image of said specimen so that a marker labeled with said selected subindex is displayed on said viewscreen of said image display unit.

7. A charged particle beam irradiation apparatus comprising:

a charged particle beam optical unit for irradiating a specimen with a charged particle beam;

a charged particle beam deflection unit for moving a position in said specimen, which is irradiated with a charged particle;

an image display unit for displaying an image of said specimen, said image being formed by using charged particles or electromagnetic waves emitted from said specimen irradiated with said charged particle beam;

a marker display unit for displaying a marker on each target position on said image of said specimen, said image being displayed on a viewscreen of said image display unit;

an marker position input unit for designating reference positions on said image of the specimen, on which respective markers are displayed; and a position calculation unit for calculating both said position on which each marker is displayed on said image of said specimen on said viewscreen of said image display unit, and the amount of displacement of said image moved by said charged particle beam deflection unit;

wherein, when said image is moved by said charged particle beam deflection unit, said position on said image of said specimen, on which each marker is displayed, is also moved based on both said calculated position of each marker, said position being calculated by said position calculation unit, and on the amount of displacement of said image, said amount of displacement of said image being calculated by said position calculation unit.

8. A charged particle beam irradiation apparatus according to claim 7, wherein said marker display unit displays a marker on the position on said image of said specimen corresponding to the same position in the coordinate system for said specimen, even if said image of said specimen is moved by moving said specimen stage.

9. A charged particle beam irradiation apparatus according to claim 7, wherein first and second reference positions on said image of said specimen are input from said marker position input unit, and said marker display unit displays markers on positions on said image of said specimen, said positions being determined based on the direction and pitch between an adjacent pair of said positions calculated by using said first and second reference positions.

10. A charged particle beam irradiation apparatus according to claim 7, wherein first and second reference positions on said image of said specimen are input by said marker position input unit, and said marker display unit displays markers on positions on said image of said specimen, said positions being obtained by dividing the interval between said first and second reference positions on said image of said specimen by an input division number.

11. A charged particle beam irradiation apparatus, comprising:

a charged particle beam optical unit for irradiating a specimen with a charged particle beam;

a charged particle beam deflection unit for moving a position in said specimen, which is irradiated with a charged particle;

an image display unit for displaying an image of said specimen, said image being formed by using charged particles or electromagnetic waves emitted from said specimen irradiated with said charged partible beam;

a marker display unit for displaying a marker on each target position on said image of said specimen, said image being displayed on a viewscreen of said image display unit;

an marker position input unit for designating reference positions on said image of the specimen, on which respective markers are displayed; and a position calculation unit for calculating both said position on which each marker is displayed on said image of said specimen on said viewscreen of said image display unit, and the amount of displacement of said image moved by said charged particle beam deflection unit;

wherein, when said image is moved by said charged particle beam deflection unit, said position on said image of said specimen, on which each marker is displayed, is also moved based on both said calculated position of each marker, said position being calculated by said position calculation unit, and on the amount of displacement of said image, said amount of displacement of said image being calculated by said position calculation unit, and wherein said marker display unit automatically displays markers, each marker being labeled with a subindex including a letter and/or a numeral on positions on which said marker position calculation unit determines that markers should be displayed based on subindices input for markers attached to at least two reference positions on said image of said specimen, said reference positions being designated by said marker position input unit by successively changing each of said subindices for said markers.

12. A charged particle beam irradiation apparatus according to claim 11, wherein when one of said subindices is selected, said marker display unit moves said image of said specimen so that a marker labeled with said selected subindex is displayed on a viewscreen of said image display unit.

13. A method of irradiating a specimen with a charged particle beam and displaying an image of said specimen, said image being formed by using charged particles or electromagnetic waves emitted from said specimen irradiated with said charged particle beam, said method comprising the steps:

displaying a marker on each target position on an image of said specimen, said image being displayed on a viewscreen of said image display unit;

reading in and calculating said position of said displayed image on which said marker is displayed, in the coordinate system for said viewscreen;

moving a specimen stage on which said specimen is held detecting the amount of displacement of said moved specimen stage; and moving said marker to a new position to be moved in said coordinate system for said viewscreen based on both said read-in and calculated position and said detected amount of displacement of said moved specimen tub.

14. A method of irradiating a specimen with a charged particle beam and displaying an image of said specimen, said image being formed by using charged particles or electromagnetic waves emitted from said specimen irradiated with said charged particle beam, said method comprising the steps:

displaying a marker on each target position on an image of said specimen, said image being displayed on a viewscreen of said image display unit;

reading in and calculating said position of said displayed image on which said marker is displayed, in the coordinate system for said viewscreen;

moving an irradiation region of said specimen, which is irradiated with a charged particle beam;

calculating the amount of displacement of said image of said specimen due to said moving of said irradiation region; and moving said marker to a new position to be moved in said coordinate system for said viewscreen based on both said read-in and calculated position and said calculated amount of displacement of said moved image.

* * * * *